(12) United States Patent
Mauder et al.

(10) Patent No.: US 11,171,230 B2
(45) Date of Patent: Nov. 9, 2021

(54) SEMICONDUCTOR DEVICE AND METHOD FOR MANUFACTURING A SEMICONDUCTOR DEVICE

(71) Applicant: Infineon Technologies Austria AG, Villach (AT)

(72) Inventors: Anton Mauder, Kolbermoor (DE); Johannes Georg Laven, Taufkirchen (DE); Hans-Joachim Schulze, Taufkirchen (DE); Werner Schustereder, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/165,831

(22) Filed: Oct. 19, 2018

(65) Prior Publication Data

US 2019/0123193 A1 Apr. 25, 2019

(30) Foreign Application Priority Data

Oct. 20, 2017 (EP) .................................... 17197563

(51) Int. Cl.
*H01L 29/78* (2006.01)
*H01L 29/40* (2006.01)
(Continued)

(52) U.S. Cl.
CPC .... *H01L 29/7813* (2013.01); *H01L 21/26506* (2013.01); *H01L 21/26513* (2013.01);
(Continued)

(58) Field of Classification Search
CPC .......................... H01L 29/086; H01L 29/7813
See application file for complete search history.

(56) References Cited

U.S. PATENT DOCUMENTS 5,637,898 A * 6/1997 Baliga ................. H01L 29/0878
257/330
6,388,286 B1 * 5/2002 Baliga ................... H01L 27/095
257/330
(Continued)

FOREIGN PATENT DOCUMENTS

DE 102016118543 A1 4/2017

OTHER PUBLICATIONS

K Yako et al., Cold (−100° C.) Carbon Co-implantation into High Phosphorus Doping Source/Drain Extensions for Aggressively Scaled NFETs, 2011, IEEE, Ext. Abs. the 11th International Workshop on Junction Technology, pp. 77-79. (Year: 2011).*
(Continued)

*Primary Examiner* — Victoria K. Hall
(74) *Attorney, Agent, or Firm* — Murphy, Bilak & Homiller, PLLC

(57) ABSTRACT

In an embodiment, a semiconductor device is provided. The semiconductor device includes: a semiconductor body of a first conductivity type having opposing first and second major surfaces; a gate arranged in a trench extending into the semiconductor body from the first major surface; a body region of a second conductivity type; a source region of the first conductivity type arranged on the body region and having first and second dopant species. The source region forms a pn-junction with the body junction, the pn-junction being arranged at a depth $d_{pn}$ from the first major surface, wherein 50 nm<$d_{pn}$<300 nm. A drain region of the first conductivity type is arranged in the semiconductor body under the trench.

11 Claims, 10 Drawing Sheets

(51) Int. Cl.
*H01L 29/08* (2006.01)
*H01L 29/66* (2006.01)
*H01L 21/265* (2006.01)
*H01L 21/324* (2006.01)
*H01L 29/417* (2006.01)
*H01L 29/10* (2006.01)

(52) U.S. Cl.
CPC .......... *H01L 21/324* (2013.01); *H01L 29/086* (2013.01); *H01L 29/407* (2013.01); *H01L 29/66734* (2013.01); H01L 29/1095 (2013.01); H01L 29/41766 (2013.01)

(56) References Cited

U.S. PATENT DOCUMENTS

| | | | |
|---|---|---|---|
| 9,773,554 B2* | 9/2017 | Lee | H01L 21/26513 |
| 9,960,268 B2* | 5/2018 | Zundel | H01L 29/0878 |
| 2003/0193066 A1* | 10/2003 | Ito | H01L 21/26506 |
| | | | 257/335 |
| 2004/0102013 A1* | 5/2004 | Hwang | H01L 21/26506 |
| | | | 438/313 |
| 2006/0131665 A1* | 6/2006 | Murthy | H01L 29/7834 |
| | | | 257/384 |
| 2006/0244080 A1* | 11/2006 | Chen | H01L 21/26586 |
| | | | 257/408 |
| 2008/0185643 A1* | 8/2008 | Hossain | H01L 29/7802 |
| | | | 257/342 |
| 2008/0197407 A1* | 8/2008 | Challa | H01L 29/0634 |
| | | | 257/330 |
| 2008/0258211 A1* | 10/2008 | Sugi | H01L 29/66734 |
| | | | 257/330 |
| 2008/0268623 A1* | 10/2008 | Bu | H01L 21/324 |
| | | | 438/511 |
| 2010/0065905 A1 | 3/2010 | Pan | |
| 2012/0322217 A1 | 12/2012 | Yeh et al. | |
| 2013/0137230 A1* | 5/2013 | Blank | H01L 29/7813 |
| | | | 438/270 |
| 2013/0221436 A1* | 8/2013 | Hossain | H01L 29/7827 |
| | | | 257/334 |
| 2013/0267083 A1* | 10/2013 | Suguro | H01L 21/2658 |
| | | | 438/527 |
| 2015/0340487 A1* | 11/2015 | Siemieniec | H01L 29/045 |
| | | | 257/77 |
| 2016/0093694 A1* | 3/2016 | Smith | H01L 27/0928 |
| | | | 257/653 |
| 2016/0126316 A1* | 5/2016 | Wu | H01L 29/6625 |
| | | | 257/190 |
| 2016/0204097 A1* | 7/2016 | Laven | H01L 29/7397 |
| | | | 361/56 |
| 2016/0254367 A1* | 9/2016 | Jin | H01L 29/4236 |
| | | | 438/269 |
| 2016/0268423 A1* | 9/2016 | Koepp | H01L 29/4236 |
| 2017/0110572 A1* | 4/2017 | Zundel | H01L 29/66734 |
| 2018/0366549 A1* | 12/2018 | Koji Ma | H01L 29/66068 |
| 2020/0083133 A1* | 3/2020 | Kahn | H01L 23/3171 |
| 2020/0105754 A1* | 4/2020 | Murthy | H01L 29/0673 |
| 2020/0119139 A1* | 4/2020 | Smith | H01L 21/761 |

OTHER PUBLICATIONS

B.J. Pawlak et al., Suppression of phosphorus diffusion by carbon co-implantation, Aug. 7, 2006, Applied Physics Letters, vol. 89, No. 062102, pp. 062102-1 to 062102-3. (Year: 2006).*

A. Vanderpool et al., Control of Phosphorus Transient Enhanced Diffusion using Co-implantation, Dec. 1, 2006, AIP Conference Proceedings, vol. 866, pp. 41-45. (Year: 2006).*

K. Ku et al., Effects of Germanium and carbon co-implants on phosphorous diffusion in silicon, Applied Physics Letters, Sep. 11, 2006, Vo. 89, No. 112104, p. 112104-1 to 112104-3. (Year: 2006).*

N. Cagnat et al., Ultrathin n+/p junction in preamorphized silicon by phosphorus and carbon coimplantation engineering: Influence of C location, Nov. 16, 2007, J. Applied Physics, vol. 102, No. 106102, p. 106102-1 to 106102-3. (Year: 2007).*

* cited by examiner

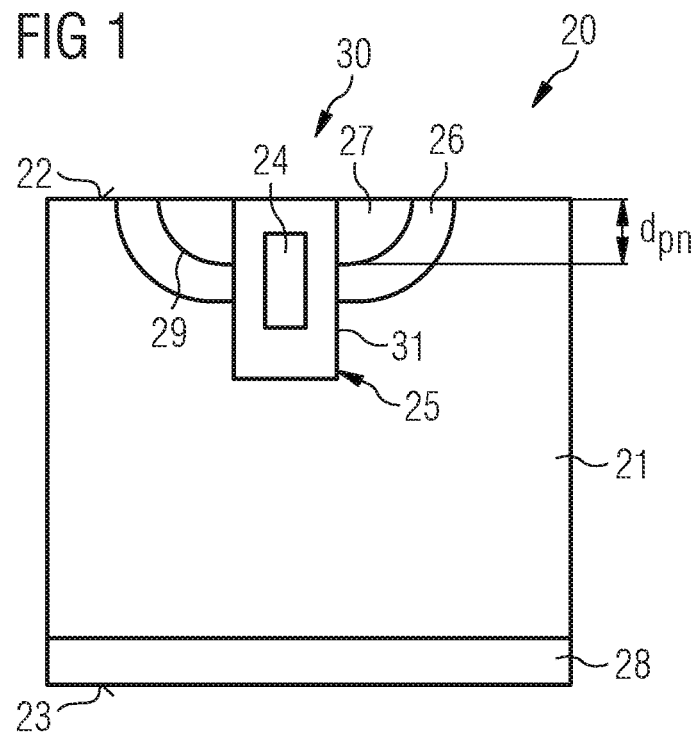
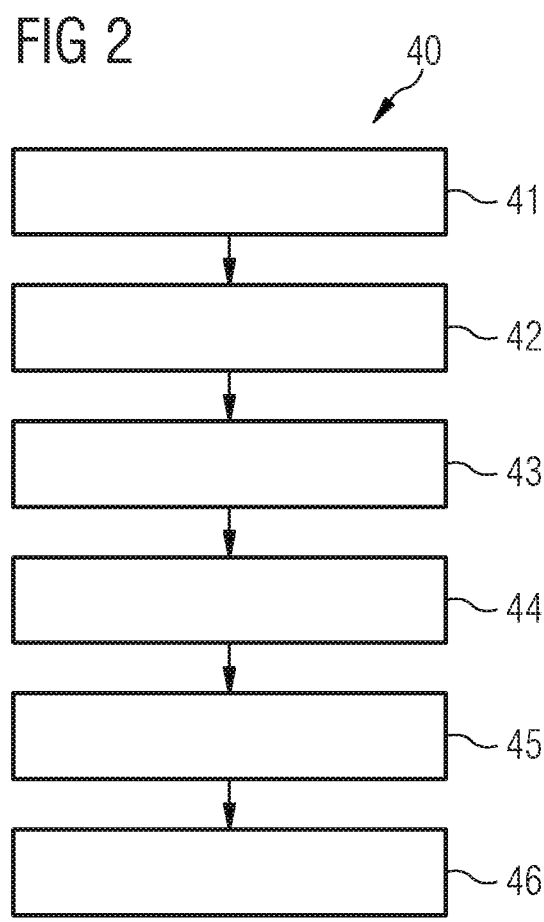

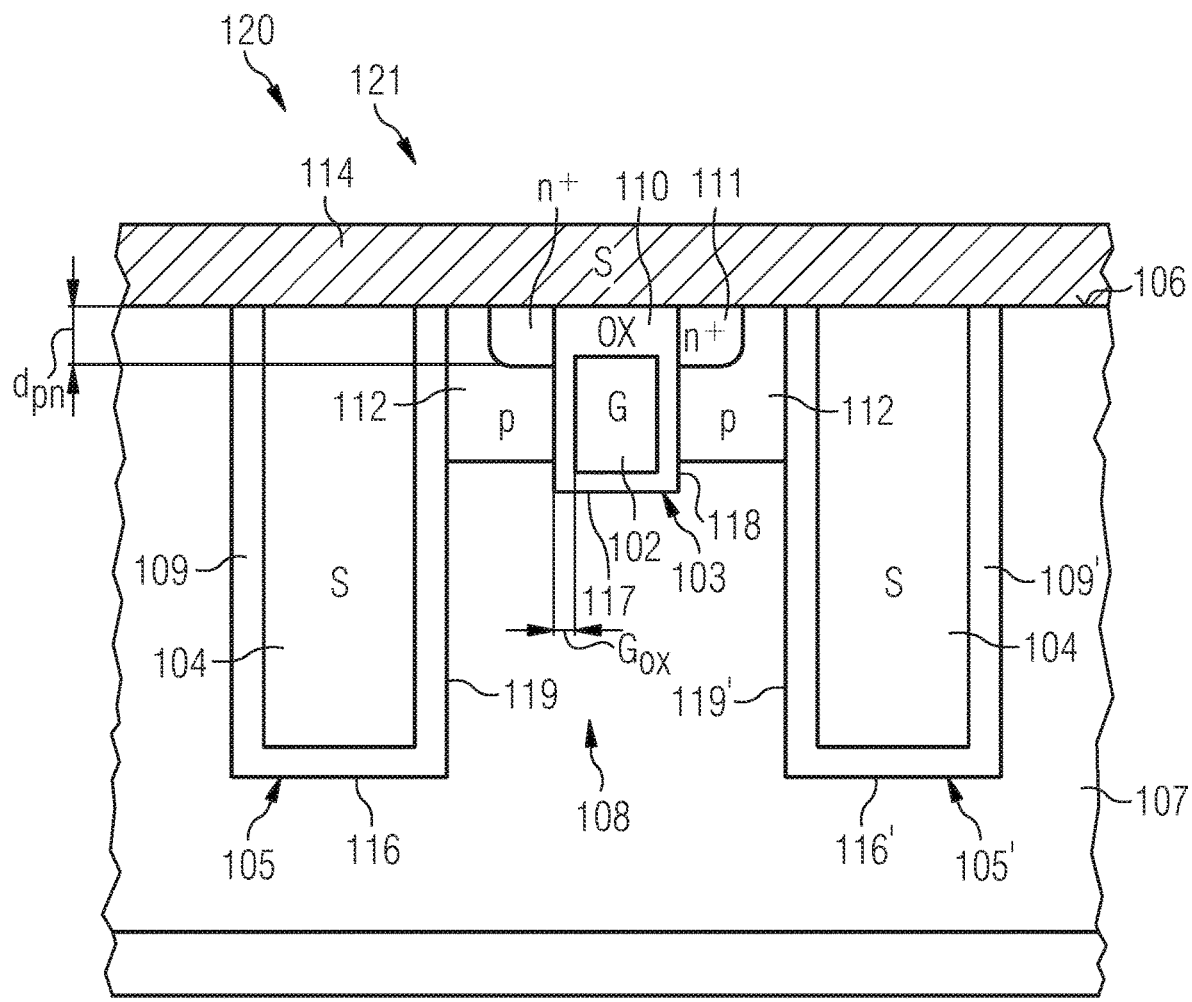

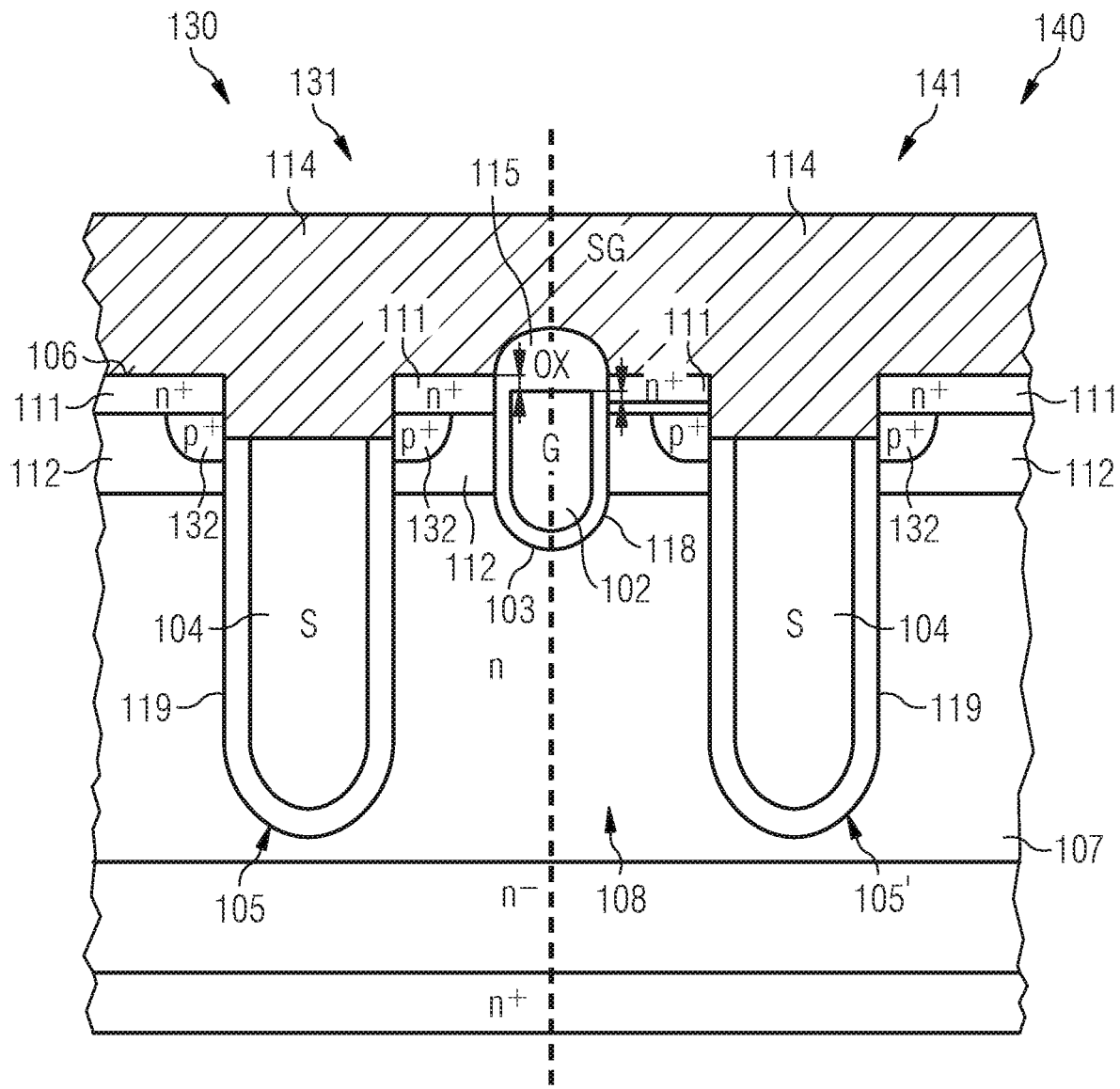

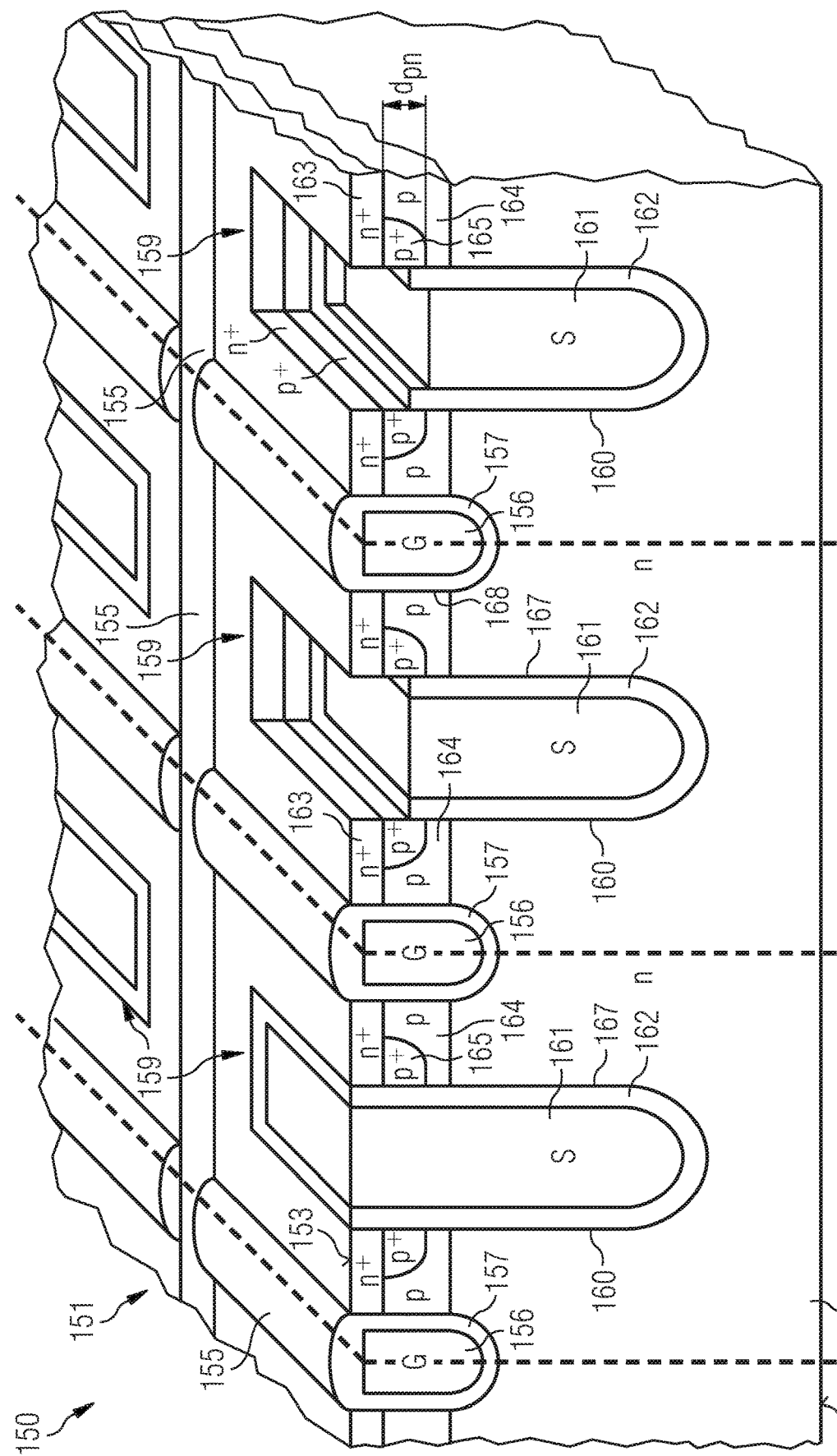

SEMICONDUCTOR DEVICE AND METHOD FOR MANUFACTURING A SEMICONDUCTOR DEVICE

BACKGROUND

Semiconductor devices, such as transistor devices, may be used for various applications, such as switches in power supplies and power converters. Examples of transistor devices include a Metal Oxide Semiconductor Field Effect Transistor (MOSFETs) and an Insulated Gate Bipolar Transistor (IGBT). It is desirable that the semiconductor devices, including transistor devices have a good and reliable performance.

SUMMARY

In an embodiment, a semiconductor device is provided. The semiconductor device comprises a semiconductor body comprising a first major surface and a second major surface opposing the first major surface wherein the semiconductor body comprises a first conductivity type, a gate arranged in a trench extending into the semiconductor body from the first major surface, a body region comprising a second conductivity type, the second conductivity type opposing the first conductivity type; a source region comprising the first conductivity type, the source region being arranged on the body region and comprising at least one first dopant species providing the first conductivity type and at least one second dopant species that is different from the first dopant species, the second dopant species affecting the diffusion of the first dopant species in the semiconductor body, wherein the source region forms a pn-junction with the body junction, the pn-junction being arranged at a depth $d_{pn}$ from the first major surface, wherein 50 nm<$d_{pn}$<300 nm, and a drain region comprising the first conductivity type, the drain region being arranged in the semiconductor body under the trench.

In an embodiment, a method for fabricating a semiconductor device is provided. The method comprises forming a trench in a first major surface of a semiconductor body comprising a first conductivity type, forming a gate in the trench, forming a body region of a second conductivity type in the semiconductor body, implanting a first dopant species into a first region of the body region, implanting a second dopant species into a second region of the body region, wherein the first dopant species provides the first conductivity type and wherein the second dopant species is different from the first dopant species and affects the diffusion of the first dopant species in the semiconductor body, thermally annealing the semiconductor body, and forming a source region, the source region comprising phosphorous and carbon, and producing a pn-junction between the source region and the body region at a depth $d_{pn}$ from the first major surface, wherein 50 nm<$d_{pn}$<300 nm.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1 illustrates a cross-sectional view of a portion of a semiconductor device according to an embodiment.

FIG. 2 illustrates a flow diagram of a method for fabricating a semiconductor device according to an embodiment.

FIG. 8 illustrates a cross-sectional view of a portion of a semiconductor device according to an embodiment.

FIG. 9 illustrates a cross-sectional view of a portion of a semiconductor device according to an embodiment.

FIG. 10 illustrates a cross-sectional view of a portion of a semiconductor device according to an embodiment.

FIG. 11 illustrates a cross-sectional view of a portion of a semiconductor device according to an embodiment.

FIG. 12 illustrates a cross-sectional view of a portion of a semiconductor device according to an embodiment.

FIG. 13 illustrates a cross-sectional view of a portion of a semiconductor device according to an embodiment.

DETAILED DESCRIPTION

Figure 3:
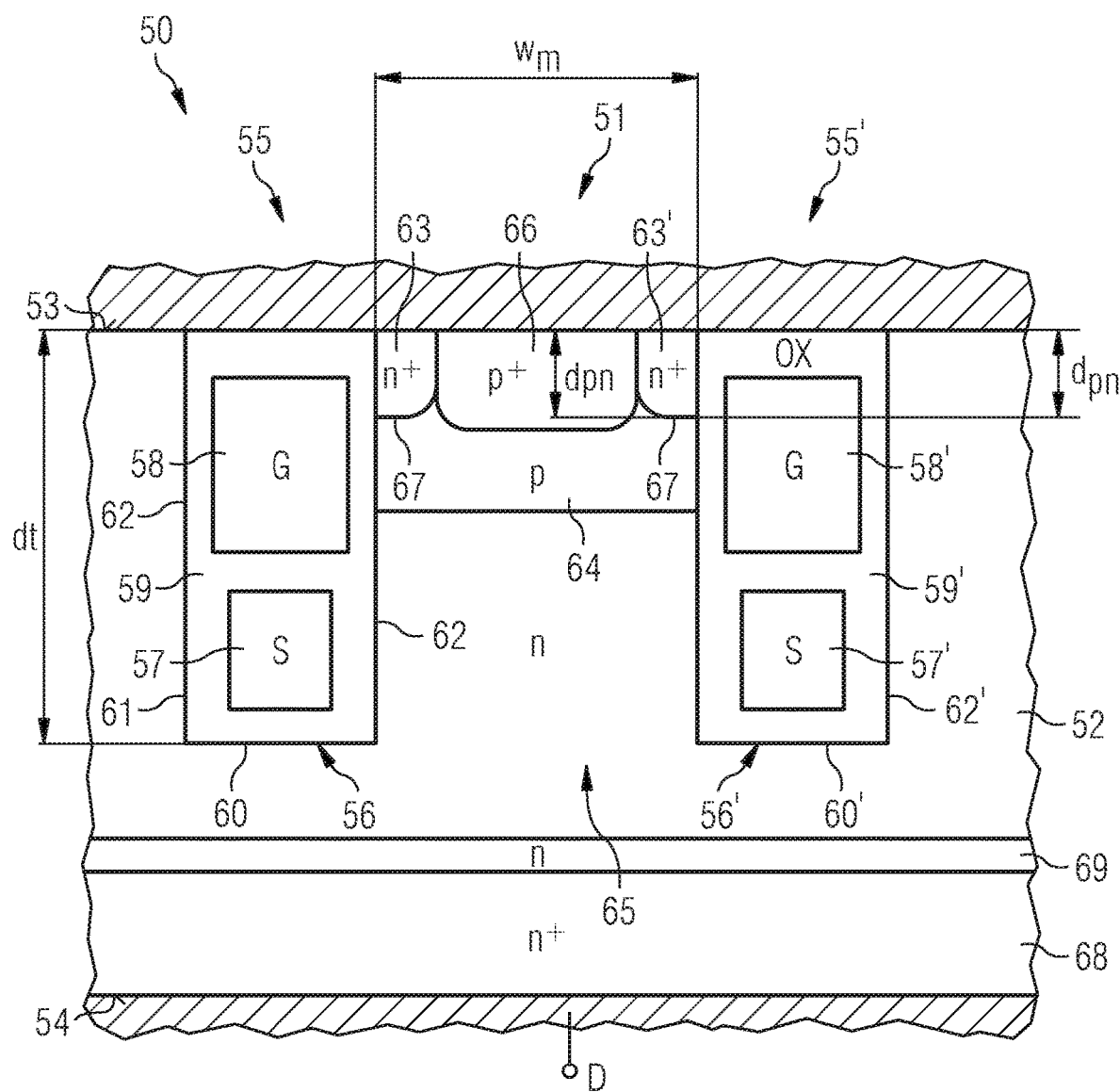
FIG. 3 illustrates a cross-sectional view of a portion of a semiconductor device according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Discrete power switches such as power MOSFET devices with blocking voltages of up to 300V, 100V, 60V, or 30V, for example, may have the requirement to provide ultra-low source path resistances. The source of MOSFETs is often built up by high dose As (arsenic) implantation due to the shallow profiles created by As Implantation and a low diffusivity during a thermal budget. Furthermore, As ions have a high stopping power in semiconductor material like e.g. Silicon, providing a low implantation depth at a given implantation energy which is compatible with commonly used beamline implantation tools in productive environment. Alternatively, As ions exhibit steeper doping gradients when implanted to a predefined depth into the semiconductor material as compared to lighter ions as e. g. Phosphorous. All this enables steep doping profiles which are favorable for the Source doping of a power MOSFET without any additional effort, i.e. cost, in the manufacturing process by selecting As as the dopant ion. However, with high dose As Implantation, there is a risk of vacancy formation from As precipitation which potentially causes drain-source leakage currents (IDSS), which may in turn result in chip failure and/or low production yields.

According to embodiments described herein, the high dose As Implantation is replaced by a combination of Carbon Implantation and Phosphorous Implantation in order to achieve the same (or even better) electrical characteristics while reducing or even eliminating the risk of IDSS failure due to the creation of As defects.

In an embodiment, a semiconductor device 20 comprises a semiconductor body 21 comprising a first major surface 22 and a second major surface 23 opposing the first major surface 22. The semiconductor body 21 includes a first conductivity type. The semiconductor device 20 further comprises a gate 24 arranged in a trench 25 that extends into the semiconductor body 21 from the first major surface 22. The semiconductor device 20 includes a body region 26 comprising a second conductivity type which opposes the first conductivity type. For example, if the first conductivity type is n-type, the second conductivity type is p-type and if the first conductivity type is p-type, the second conductivity type is n-type. The semiconductor device 20 further includes a source region 27 comprising the first conductivity type that is arranged on the body region 26 and a drain region 28 comprising the first conductivity type which is arranged in the semiconductor body 21 under the trench 25.

The source region 27 is arranged on the body region 26 such that a pn junction is formed at the interface 29 between the source region 27 and the body region 26. The interface 29 and the pn junction is arranged at a depth $d_{pn}$ from the first major surface 22. At least a portion of the interface and at least a portion of the pn junction may lie at a depth $d_{pn}$ in the range of 50 nm to 300 nm.

The source region 27 comprises two or more different dopants or dopant species. At least one of the dopants or dopant species provides donors, in embodiments in which the source region 27 is n-type, or acceptors, in embodiments in which the source region 27 is p-type. One or more of the dopants or dopant species comprises an element or ion which differs from the donor or acceptor and which is selected to affect the diffusion of the donor or acceptor in the semiconductor body, in particular diffusion of the donor or acceptor in the semiconductor body upon application of heat to the semiconductor body, e.g. upon thermal annealing. One or more first dopant species is used to provide conductivity in the source region 27 and one or more second dopant species, that are different to the first dopant species, are used to control the volume of the source region 27. The second dopant species may be considered to have a diffusion reduction or deceleration function when present in combination with the first dopant species, the first dopant species providing donors or acceptors and conductivity in the source region 27.

In some embodiments, the source region 27 comprises phosphorus as a first dopant species which acts as a donor and carbon as a second dopant species which affects the diffusion of phosphorus within the semiconductor body 21 upon the application of heat to the semiconductor body 21. The source region 27 may further comprise one or more of fluorine, antimony, or germanium as a second dopant species. The source region 27 is free of implanted arsenic dopants and may be entirely arsenic free.

The semiconductor device 20 includes a transistor structure 30 which is typically provided as one of a large number of substantially identical transistor structures or transistor cells which are coupled together. In some embodiments, the transistor structures or transistor cells are coupled together such that the semiconductor device provides a single switch. However, groups of transistor structures or transistor cells may be coupled together such that the semiconductor device 20 provides two or more switches. The semiconductor device may provide a transistor device having a blocking voltage of up to 300 V and, therefore, differs from a logic device not only in this blocking voltage, but also in the depth or spacing of the pn junction between the source region 27 and body region 26 from the first major surface 22. At least a portion of the pn junction between the source region 27 and body region 26 is arranged at a depth $d_{pn}$ from the first major surface 22, where $d_{pn}$ lies in the range of 50 nm to 300 nm.

The source region 27 may have the form of a well which borders on the first major surface 22 and the body region 26 may surround the source region 27 such that the source region 27 is not in direct contact with the semiconductor body 21.

The trench 25 may comprise an insulating material which lines the sidewalls and base of the trench 25 and electrically isolates the gate 24 positioned within the trench 25 from the semiconductor body 21. The gate 24 may comprise conductive material and may comprise polysilicon or metal.

The concentration of the first dopant species, for example phosphorus, in the source region 27 may be in the range of $5 \cdot 10^{19}$ atoms/cm' up to $7 \cdot 10^{20}$ atoms/cm' or in the range of $1 \cdot 10^{20}$ atoms/cm' up to $3 \cdot 10^{20}$ atoms/cm' and the concentration of the second dopant species, for example carbon, in the source region 27 may be in the range of $1 \cdot 10^{19}$ up to $7 \cdot 10^{20}$ atoms/cm'. The distribution of the first dopant species concentration and/or distribution of the second dopant species concentration within the source region 27 may vary, for example be spatially non-uniform.

In embodiments in which the source region includes phosphorous and carbon, the distribution of the phosphorus concentration and/or distribution of the carbon concentration within the source region 27 may vary, for example be spatially non-uniform. For example, the concentration of carbon may be higher towards the base of the source region 27 than towards the top of the source region 27, that is higher in directions towards the interface 29 between the source region 27 and the body region 26 and lower in directions towards the first major surface 22. For example, the concentration of carbon may even reach its maximum not inside the source region 27 but inside the body region 26.

In some embodiments, the source region 27 extends from a sidewall 31 of the trench 25 and the body region 26 extends from the sidewall 31 of the trench 25 such that the interface 29 between the source region 27 and the body region 26 extends from the sidewall 31 to the first major surface 22.

A source region comprising two or more differing dopants elements and having a pn junction between the source region and the body region at a depth $d_{pn}$ from the first major surface of 50 nm to 300 nm may be used in semiconductor devices including differing transistor structures and is not limited to the exemplary transistor structure 30 illustrated in FIG. 1. For example, the semiconductor device 20 may further include a body contact region comprising the second conductivity type which is more highly doped than the body region. The semiconductor device may include a further trench which extends into the semiconductor body from the first major surface. The semiconductor device may further include a field plate which is arranged in the same trench as the gate and under the gate or in a separate trench. The trenches may be elongate, for example strip-like in plan view, or columnar. The semiconductor body 21 may include an epitaxial layer, for example a monocrystalline epitaxial silicon layer, or a single-crystal substrate, for example silicon wafer.

FIG. 2 illustrates a flow diagram 40 of a method for fabricating a semiconductor device. In box 41, a trench is formed in a first surface of a semiconductor body which comprises a first conductivity type. In box 42, a gate is formed in the trench. In box 43, a body region of the second conductivity type is formed in the semiconductor body. In box 44, one or more second dopant species, for example carbon and optionally fluorine, is implanted into a first region of the semiconductor of the body region. In box 45, one or more first dopant species, for example phosphorus ions, is implanted into a second region of the body region. In box 46, the semiconductor body is thermally annealed forming the source region comprising the first and second dopant species, for example phosphorus and carbon, and producing a pn junction between the source region and the body region at a depth $d_{pn}$ from the first major surface, whereby $d_{pn}$ lies in the range of 50 nm to 300 nm, for example.

The first and second dopant species may be implanted sequentially or concurrently into the body region. For example, the second dopant species may be implanted into a first region of the body region and, subsequently, the first dopant species may be implanted into a second region of the body region. In other embodiments, the order of implantation can be reversed, such that the first dopant species is first implanted and subsequently, the second dopant species is implanted into the body region.

In some embodiments, the carbon and phosphorus ions may be implanted sequentially or concurrently into the body region. For example, the carbon may be implanted into a first region of the body region and, subsequently, phosphorus ions may be implanted into a second region of the body region. In other embodiments, the order of implantation can be reversed, such that the phosphorus ions first implanted and subsequently, the carbon is implanted into the body region.

The first region and the second region may refer to the same volume or may refer to overlapping volumes or may refer to different volumes of the body region. For example, the first dopant species may be implanted into at least a portion of the first region which already includes the second dopant species. This portion of the first region forms the second region. For example, phosphorus ions may be implanted into at least a portion of the first region which already includes carbon.

The concentration of the first and second dopant species within the source region may vary and be spatially non-uniform. For example, the concentration of the second dopant species may be greater in a direction towards the interface between the source region and the body region. In some embodiments, the first dopant species and/or the second dopant species are each implanted in multiple steps. The implantation conditions may be for each step may be carried out such that the first dopant species and/or the second dopant species are implanted at decreasing or increasing depth from the first major surface, for example.

The concentration of phosphorus and/or carbon within the source region may vary and be spatially non-uniform. For example, the concentration of carbon may be greater in a direction towards the interface between the source region and the body region. In some embodiments, the phosphorus ions and/or the carbon are each implanted in multiple steps. The implantation conditions for each step may be carried out such that the phosphorus ions and/or carbon are implanted at decreasing or increasing depth from the first major surface, for example.

The conditions of the thermal annealing may be selected depending on the first and second dopant species. The thermal annealing may be carried out at a temperature in the range of 900° C. to 1050° C. for a time in the range of 1 s (second) to 360 s (seconds). In some embodiments, a multiple stage thermal annealing is carried out. For example, three annealing treatments, each for a time period of 30 seconds, may be carried out at a temperature between 950° C. and 1000° C. These conditions may be used for phosphorous and carbon, for example.

The method according to any one of the embodiments described herein is used to form a source region of a transistor device. As discussed above, a transistor device typically includes a large number of transistor structures or cells which are coupled in parallel to produce a single switch. The source including at least two different dopant species, such as carbon and phosphorus, may be used in a various types of transistor structure which comprise differing features. The method for fabricating the semiconductor device and transistor structure may also, therefore, include additional embodiments for forming various transistor structures.

In an embodiment, the method further comprises forming a field plate in a base of the trench and forming the gate on the field plate. The gate and the field plate are arranged in a single trench and are electrically insulated from one another and from the semiconductor body. The field plate may include poly silicon or a metal and the gate may also include poly silicon or metal. The method may further comprise forming an insulating material on walls of the trench and forming a field plate on the insulating material, forming a further insulating material on sidewalls of the trench and on the field plate and forming the gate on the further insulating layer. The insulating layer may be referred to as field oxide and the further insulating layer may be referred to as a gate oxide. The insulating layer may have a greater thickness than the thickness of the further insulating layer. The insulating layer may have a greater thickness on the base of the trench than on the lower portion of the sidewalls of the trench and the thickness of the further insulating layer may be greater in the region between the field plate and the base of the gate than on the sidewalls of the upper portion of the trench. The insulating layer may surround a gap at the base of the trench in which the field plate may be formed. The further insulating layer may surround a gap at in the upper portion of the trench in which the gate may be formed.

The field plate may be electrically coupled to source potential by means of a conductive redistribution structure extending directly from a portion of the field plate, or by a conductive via that is typically positioned outside of the active area of the semiconductor device. Alternatively, the field plate may be coupled to gate potential.

In some embodiments, the method further comprises forming a body contact region. The body contact region includes the second conductivity type and may be coupled with the body region. The body contact region may be more highly doped than the body region. In embodiments in which the body region and the body contact region are p-type, the body contact region may be formed by implanting acceptors into the semiconductor body at a position which borders or overlaps with the body region.

In some embodiments, the transistor structure includes a gate and a field plate in different trenches. In these embodiments, the method may comprise forming a further trench extending into the semiconductor body from the first major surface such that the further trench is laterally spaced apart from the source region and from the trench in which the gate is to be formed. A field plate is formed in the further trench. An insulating layer may be first formed on the base and on the sidewalls of the further trench and the field plate formed on the insulating layer. The insulating layer may surround a gap in the further trench which is filled with conductive material to form the field plate.

As discussed above, the transistor structure including the source region, which comprises two different dopant species, for example a first dopant species providing donors or acceptors and a second dopant species which affects, in particular, reduces or decelerates, the diffusion of the first dopant species within the semiconductor body upon application of heat to the semiconductor body, and which forms a pn junction with the body region having at least a portion that is arranged at a depth $d_pn$ from the first major surface of 50 nm to 300 nm, is not limited to that illustrated in FIG. 1. FIGS. 3 to 14 illustrate further examples of transistor structures in which a source region according to any of the embodiments described herein may be used.

FIG. 3 illustrates a cross-sectional view of a portion of a semiconductor device 50 comprising a transistor device 51. The semiconductor device 50 includes a semiconductor body 52 having a first major surface 53 and a second major surface 54 which opposes the first major surface 53. The semiconductor body 52 may comprise silicon and may comprise a monocrystalline epitaxial silicon layer grown on a substrate or may comprise a single crystal silicon. The transistor device 51 includes a plurality of transistor structures or cells 55, 55' coupled in parallel. Each transistor cell 55, 55' comprises a trench 56 which comprises a field plate 57 arranged towards a bottom of the trench 56 and a gate 58 arranged in the trench 56 above the field plate 57 and, therefore, in an upper portion of the trench 56. The trench 56 may have a substantially elongate strip-like structure extending into the plane of the drawing.

The trench 56 further includes an insulating material 59 which lines the base 60 and sidewalls 62 of the trench 56 and electrically insulates the field plate 57 from the gate 58. The thickness of the insulating layer 59 may be greater at the base 60 and lower portion 61 of the sidewalls 62 of the trench 56 such that the field plate 57 has a width which is less than a width of the gate 58. The insulating layer 59 may have a smaller thickness on the sidewalls 62 in the upper portion of the trench 56 between the gate 58 and the sidewall 62 and may have a greater thickness between an upper surface of the field plate 57 and a lower surface of the gate 58.

The semiconductor device 50 includes a plurality of transistor cells 55 which are arranged such that the trenches 56 extend substantially parallel to one another. The region between neighbouring trenches 56, 56' defines a mesa 65.

The semiconductor body 52 comprises a first conductivity type, which in this particular embodiment is n-type. The transistor structure 51 includes a source region 63 which comprises the first conductivity type, in this particular embodiment n-type, which extends from the first major surface 53 into the semiconductor body 52 at a position bordering the sidewall 62 of the trench 56. The source region 63 may form a portion of the sidewall 62 of the trench 56. The transistor structure 51 further includes a body region 64 which comprises the second conductivity type, in this embodiment p-type, which is positioned below the source region 63 with respect to the first major surface 53 and extends between neighbouring trenches 56, 56'.

The source region 63 forms a pn junction with the body region 64 at an interface 67 which is positioned at a depth $d_pn$ from the first major surface 63 of the semiconductor body 52 in regions immediately laterally adjacent the sidewall 52 of the trench 56. This pn junction is arranged as a depth $d_{pn}$ from the first major surface 53 which lies in the range of 50 nm to 300 nm. The source region 63 comprises first dopants to produce a n-type conductivity, in particular, phosphorus, and second dopants, having a different composition from the first dopant, which are selected to affect the diffusion of the first dopant when the semiconductor body is subjected to a thermal anneal to activate the first dopant and form the source region 63 of the first conductivity type. The second dopant may include carbon and/or fluorine. The source region 63 is free of arsenic dopants.

The transistor structure 51 further includes a body contact region 66 which comprises the second conductivity type and which is more highly doped than the body region 64. In the embodiment illustrated in FIG. 3, the body contact region 66 has the form of a well extending from the first major surface 53 into the semiconductor body 52. The body contact region 66 extends between neighbouring source regions 63, 63' arranged at opposing sides of the mesa 65 and is positioned in a central portion of the width $w_m$ of the mesa 65 and on the body region 64.

In some non-illustrated embodiments, the body contact region 66 may reach deeper into the semiconductor body 52 than the depth of the pn junction $d_{pn}$ and may be located also laterally underneath a part of the source region 63. However, the body contact region 66 is laterally spaced apart from the insulating layer 59 insulating the gate electrode 58 from the body region 64.

The transistor device 51 further includes a drain region 68 comprising the first conductivity type. In this embodiment, the drain region 68 is positioned at the second major surface 54 of the semiconductor body 62. The transistor device 51 may further include a further layer 69 that is lightly doped with the first conductivity type and positioned between the drain region 68 and the semiconductor body 52.

The mesa 65 has a width $w_m$ which comprises, at the first major surface 53, the source region 63, the body contact region 66 and the source region 63' of the neighbouring transistor cell 55. The mesa 65 has a length $l_m$ which extends substantially perpendicular to the width $w_m$ into the plane of the drawing. The height of the mesa corresponds to the depth of the trench $d_t$. The body region 64 extends across the entire width $w_m$ of the mesa 65.

Figure 4:
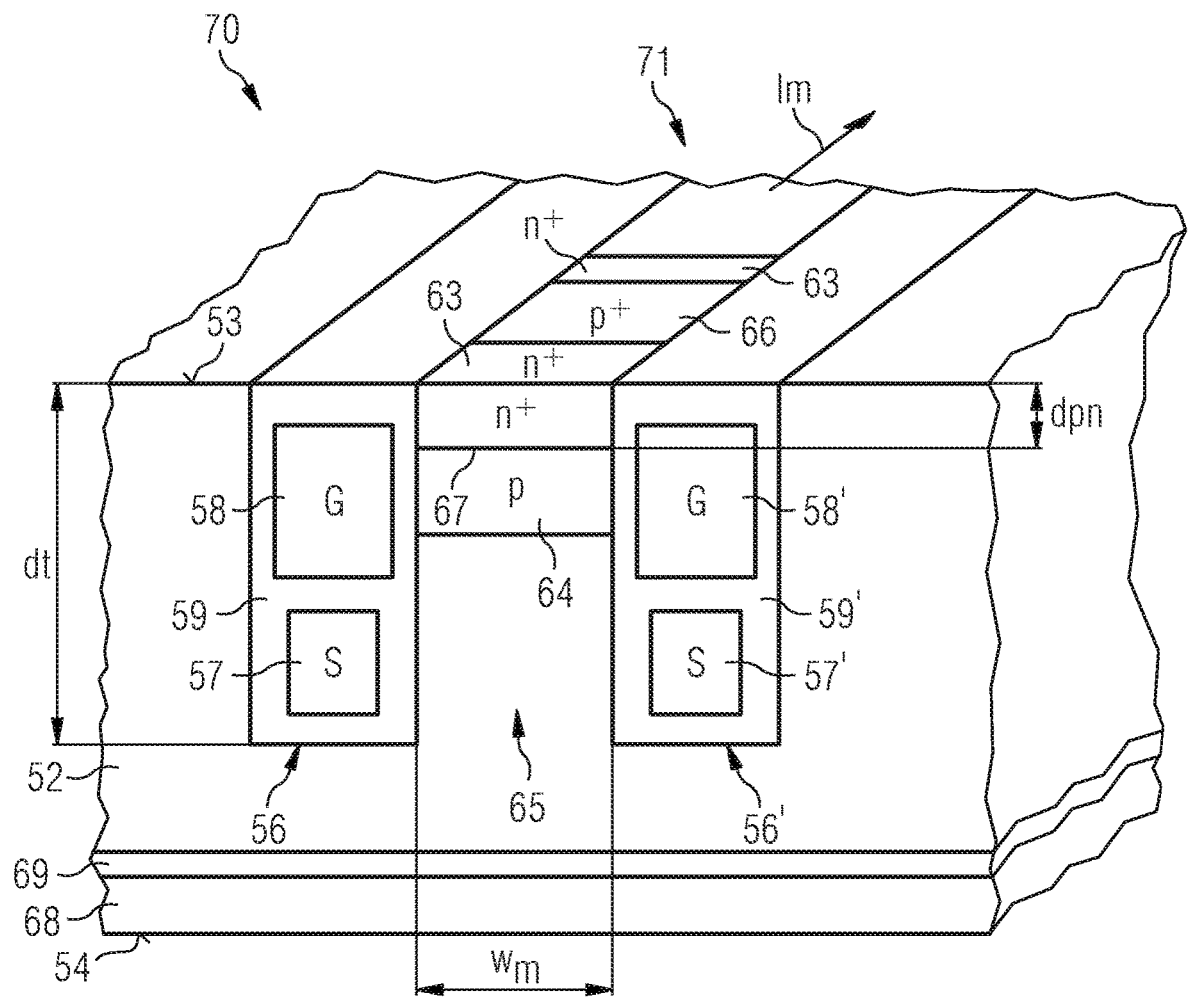
FIG. 4 illustrates a cross-sectional view of a portion of a semiconductor device according to an embodiment.

FIG. 4 illustrates a cross-sectional view of a portion of a semiconductor device 70 including a transistor structure 71 which is similar to that illustrated in FIG. 3, whereby like reference numerals denote similar parts. The transistor structure 71 differs in the arrangement of the source region 63 and body contact region 66.

FIG. 4 illustrates two trenches 56, 56' separated by a mesa 65, whereby each trench 56 includes a field plate 57 arranged towards the bottom of the trench 56 and a gate 58 arranged towards the top of the trench 56 which is electrically insulated from the field plate 57. In this embodiment, a single source region 63 extends the across the top surface of the mesa 65 and extends across the entire width $w_m$ of the mesa 65. The single source region 63 forms part of the sidewall 62 of the two neighbouring trenches 56, 56'. The body region 64 also extends across the entire width $w_m$ of the mesa 65 and is positioned underneath and forms a pn junction 67 with the source region 63 which extends throughout the entire width $w_m$ of the mesa 65. The pn junction 67 is arranged at a depth $d_{pn}$ of between 50 nm and 300 nm from the first major surface 53.

In this embodiment, the transistor structure 71 includes a body contact region 66 which is arranged adjacent the source region 63 in the direction of the length $l_m$ of the mesa 65. The body contact region 66 is arranged on a portion of the body region 64 which is arranged adjacent the source region 63 in the direction of the length $l_m$ of the Mesa 65. The body contact region 66 also extends across the entire width $w_m$ of the mesa 65 and forms a pn junction with the source region 63 that extends across the entire width $w_m$ of the mesa 65. The top surface of the mesa 65 comprises alternate source regions 63 and body contact regions 66 in a direction $l_m$ which is substantially perpendicular to the width $w_m$ of the mesa 65 and to the depth $d_t$ of the trenches 56, 56'.

Figure 5:
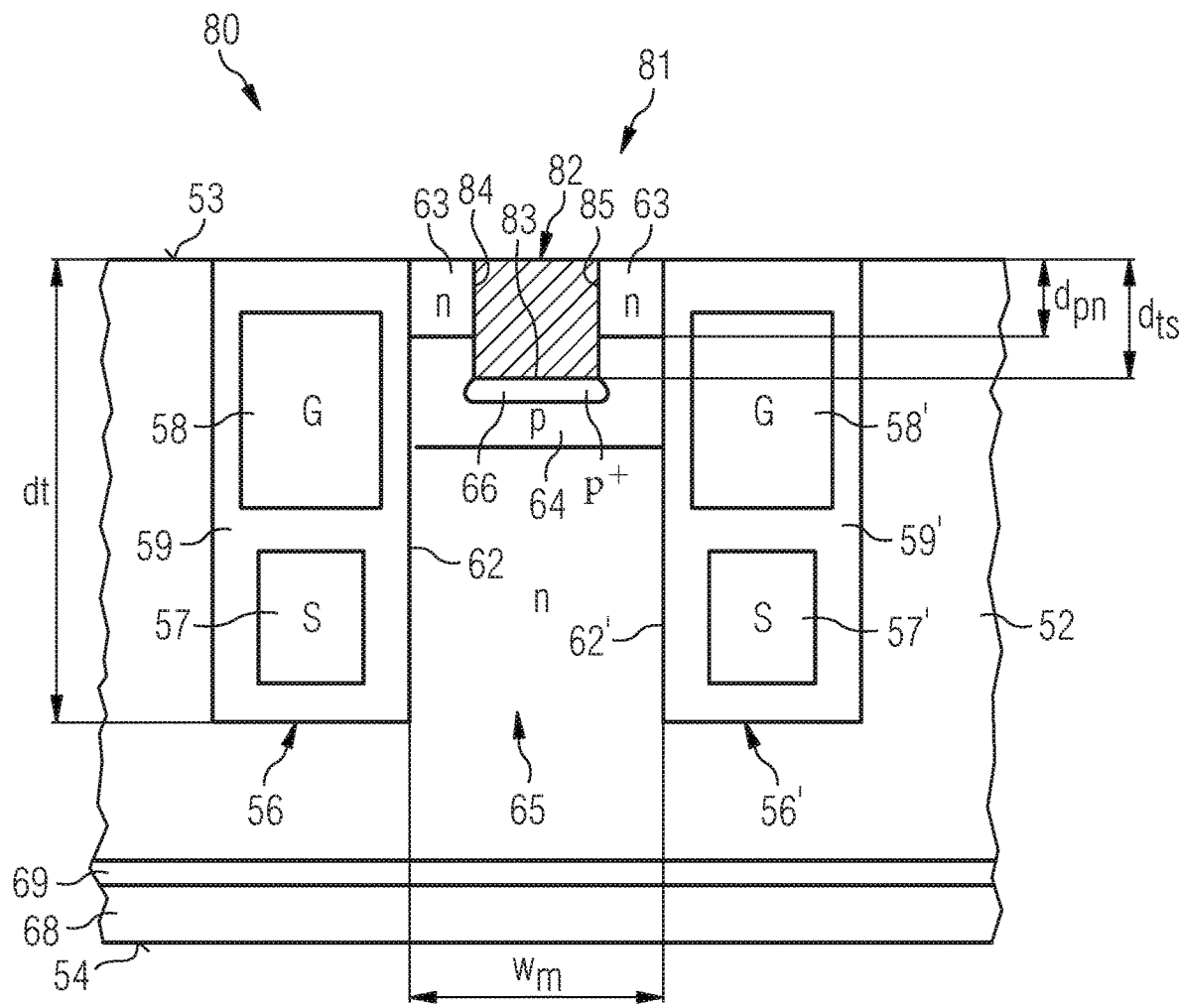
FIG. 5 illustrates a cross-sectional view of a portion of a semiconductor device according to an embodiment.

FIG. 5 illustrates a cross-sectional view of a portion of a semiconductor device 80 including a transistor structure 81. The transistor structure 81 differs from that illustrated in FIG. 3 in that the mesa 65 includes a shallow trench 82 which extends from the first major surface 53 into the semiconductor body 52 and has a depth $d_{ts}$ to which is less than the depth $d_t$ of the trenches 56 which include the field plate 57 and gate 58. The mesa 65 includes a source region 63 which extends from the sidewall 62 of the trench 56 to a sidewall 84 of the shallow trench 82 and from the sidewall 62' of the trench 56' to the sidewall 85 of the shallow trench 82. The source region 63 borders the upper portion of the sidewalls 84, 85 shallow trench 82 and is arranged on a body region 64 which extends across the width $w_m$ of the mesa 65. The base 83 of the shallow trench 82 is arranged in the body region 64. The lower part of the sidewalls 84, 85 of the shallow trench 82 is formed by the body region 64. The depth $d_{ts}$ of the base of the shallow trench 82 from the first major surface 53 is greater than the depth $d_{pn}$ of the interface between the source region 63 and the body region 64. The transistor structure 81 further includes a body contact region 66 which is arranged in the body region 64 and surrounds the base 83 of the shallow trench 82.

In some non-illustrated embodiments, the body contact region 66 may laterally exceed the dimensions of the shallow trench 82. However, the body contact region 66 will be laterally spaced apart from the insulating layer 59 insulating the gate electrode 58 from the body region 64. The shallow trench 82 may be lined or filled with conductive material and may be coupled to source potential.

Figure 6:
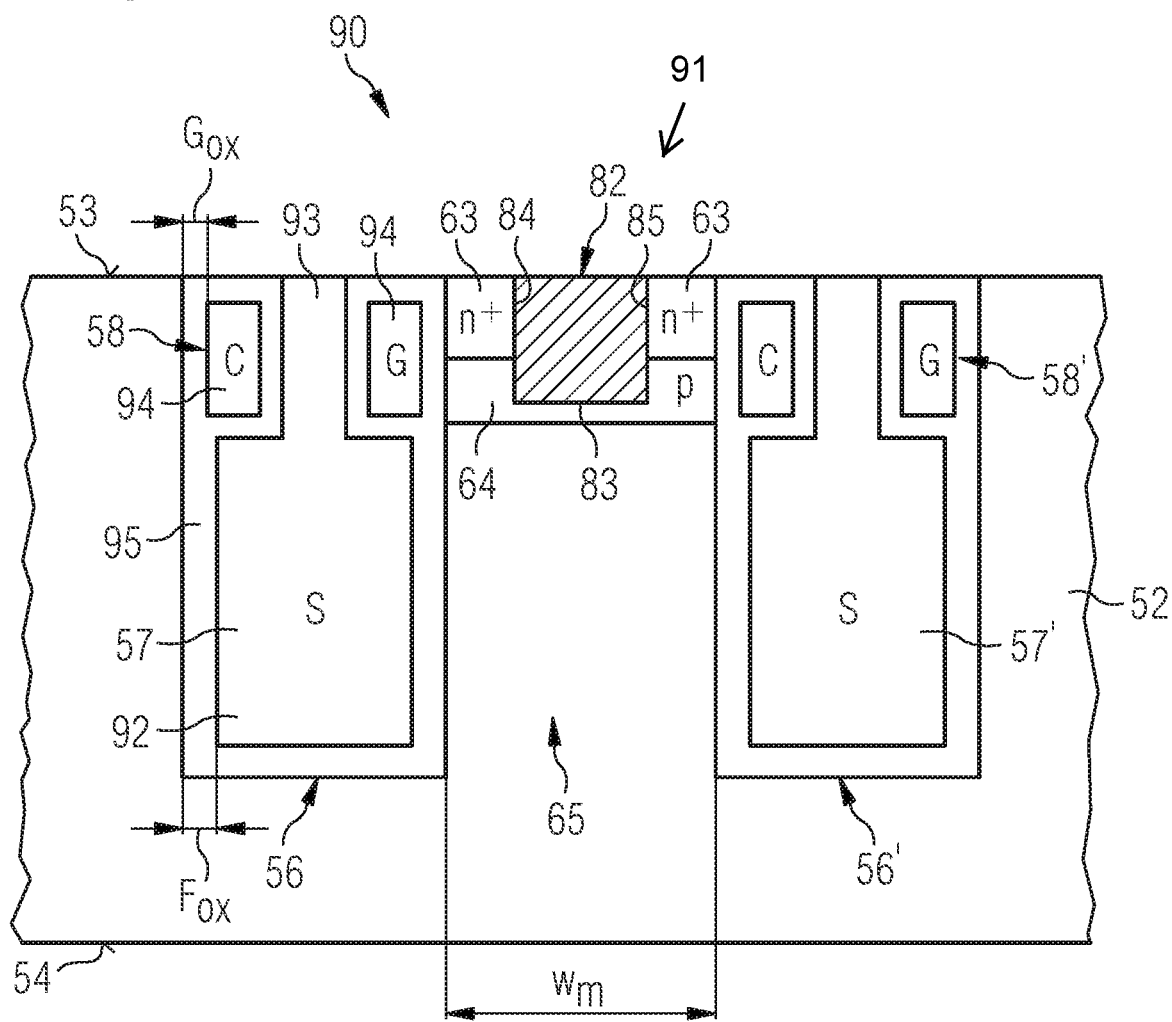
FIG. 6 illustrates a cross-sectional view of a portion of a semiconductor device according to an embodiment.

FIG. 6 illustrates a cross-sectional view of a portion of a semiconductor device 90 including a transistor structure 91 and illustrates two trenches 56, 56' separated by a mesa 65. In this embodiment, the mesa 65 includes a shallow trench 82 which extends from the first major surface 53 into the body region 64. The source region 63 is arranged on the body region and bounds sidewalls 84, 85 of the shallow trench 82 as in the embodiment illustrated in FIG. 5.

The trenches 56 include a field plate 57 and gate 58 as in the embodiments illustrated in FIGS. 3 to 5. However, in the embodiment illustrated in FIG. 6, the gate 58 has a split gate structure and the field plate 57 extends to the first major surface 53. The lower portion 92 of the field plate 57 is laterally wider than an upper portion 93 of the field plate 57. The upper portion 93 extends to the first major surface 53. The gate 58 includes two portions 94 which are arranged on opposing sides of the narrow upper portion 93 of the field plate 57. The two portions 94 of the gate 58 are electrically insulated from the field plate 93 by an electrically insulating layer 95. The thickness of the electrically insulating layer 95 may be greater at the sidewalls 62 and base 60 of the trench 56 to provide a field oxide (Fox) and have a smaller thickness between the portions 94 of the gate and sidewall of the trench 56 to provide a gate oxide (Gox). The thickness of the insulating layer 95 between the shoulders of the field plate 57 and the gate portion 94 lying above the shoulders may be greater than the thickness of the insulating layer 95 providing the gate oxide. The insulating layer 95 may be provided by two or more sublayers.

In the transistor structures illustrated in FIGS. 3 to 6, the gate and the field plate are arranged in the same trench. However, in other embodiments, the gate and the field plate may be arranged in different trenches.

Figure 7:
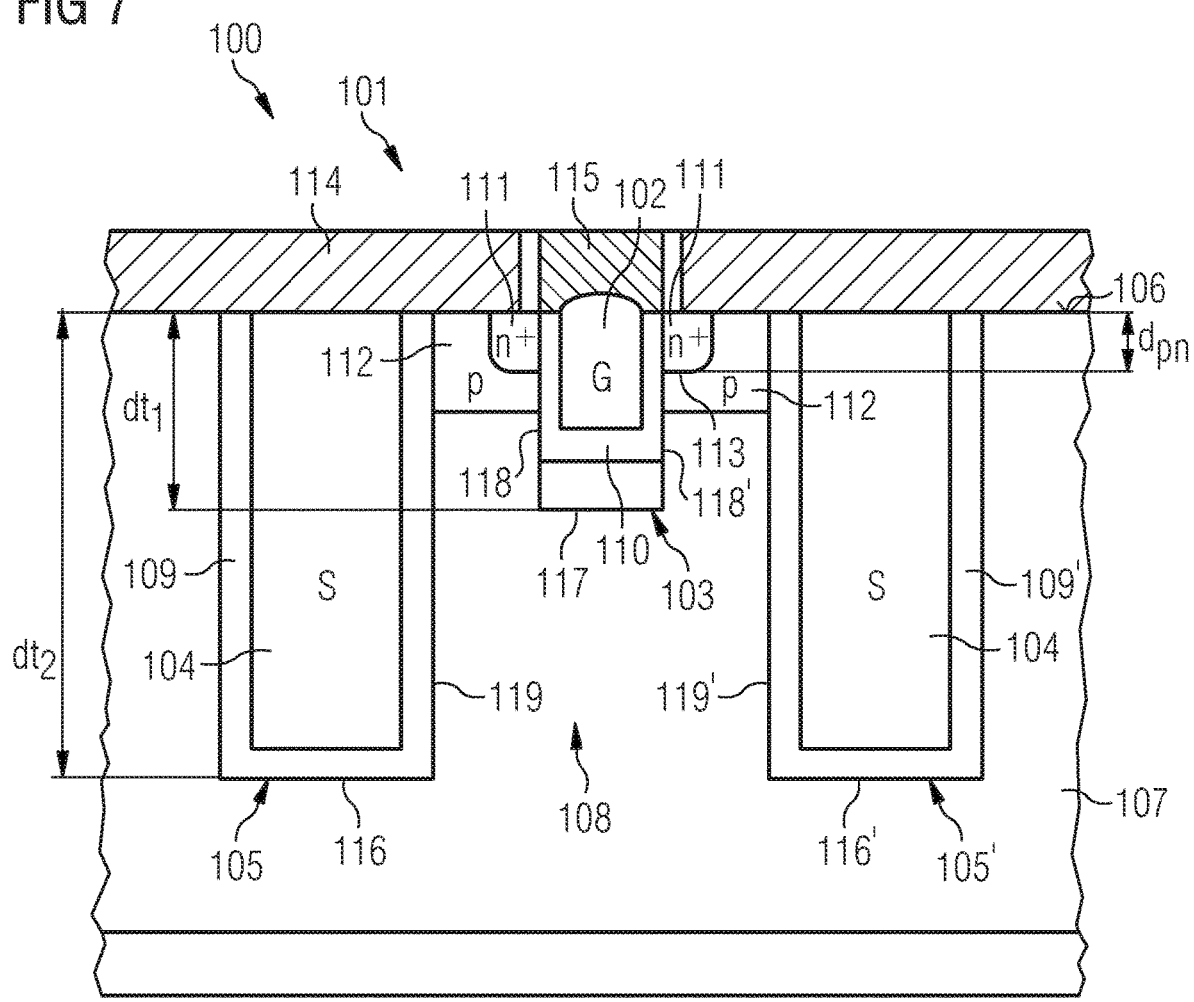
FIG. 7 illustrates a cross-sectional view of a portion of a semiconductor device according to an embodiment.

FIG. 7 illustrates a semiconductor device 100 comprising a transistor device 101 in which the gate 102 is positioned in a first trench 103 and the field plate 104 is arranged in a second trench 105 that is laterally spaced apart from the first trench 103. The first trench 103 and second trench 105 extend from the first major surface 106 into the semiconductor body 107. The semiconductor body 107 may be considered to comprise a mesa 108 formed by and extending between the second trenches 105. The second trench 105 has a depth $d_{t2}$ which is greater than the depth $d_{t1}$ of the first trench 103. The first trench 103 and second trench 105 have an elongate strip-like form extending into the plane of the drawing. The base 116 of the second trench 105 is arranged within the semiconductor body 107 and the base 117 of the first trench 103 is arranged in the mesa 108 defined by the second trenches 105. The semiconductor body 107 may be doped with the first conductivity type. The semiconductor body 107 may be provided by an epitaxial silicon layer arranged on a substrate, for example a heavily doped substrate of the second conductivity type.

The second trench 105 is lined with an insulating material forming an insulating layer 109 which surrounds the field plate 104 and electrically insulating the field plate 104 from the semiconductor body 107. The first trench 103 is also lined by insulating layer 110 which surrounds the gate 102. The thickness of the insulating layer 109 may be greater at the base of the first trench 103 in comparison to its thickness between the sidewalls of the gate 102 and the sidewalls 118 of the first trench 103. Optionally, the thickness of the insulating layer 109 may substantially equal at the base of the first trench 103 in comparison to the thickness of the insulating layer 110 between the sidewalls of the gate 102 and the sidewalls 118 of the first trench 103. The transistor structure 101 includes source regions 111 comprising two different dopant species which have the form of a well formed in the first surface 106 adjacent opposing sidewalls 110 of the first trench 103. The source regions 111 form part of the sidewall 118 of the first trench 103. The source regions 111 are formed in a body region 112 which extends between the sidewall 119 of the second trench 105 and the sidewall 118 of the first trench 103 and between the opposing sidewall 118' of the first trench 103 and the sidewall 119' of the second trench 105'. The body region 112 forms a pn junction with the underlying portion of the semiconductor body 107 forming the mesa 108. A pn junction 113 is formed between the source region 111 and the body region 112 which has a depth $d_{pn}$ from the first major surface 106 at its deepest point which lies within 50 nm and 300 nm of the first major surface 106.

The source region 111 comprises two different dopant species; first dopants to produce a n-type conductivity, in particular, phosphorus, and second dopants, having a different composition from the first dopant, which are selected to affect the diffusion of the first dopant when the semiconductor body is subjected to a thermal anneal to activate the first dopant and form the source region 111 of the first conductivity type. The second dopant may include carbon and/or fluorine. The source region 111 is free of arsenic dopants.

A conductive layer 114, which may include metal, is arranged on each of the second trenches 105 and may be directly in contact with the conductive field plate 104 which extends to the first major surface 106. The conductive layer 114 may also extend onto and be in direct contact with the source region 111 and the body region 112 and be electrically insulated from and separate from the gate 102 in the first trench 103. The transistor structure 101 may also include a gate metal 115 which is arranged on the gate 102 and is electrically insulated from the conductive layer 114 that is coupled to the source region 111.

FIG. 8 illustrates a semiconductor device 120 comprising a transistor device 121 which has a similar transistor structure to that illustrated in FIG. 7. Like reference numerals are used to indicate similar parts.

The transistor structure 121 differs from the transistor structure 101 illustrated in FIG. 7 in the arrangement of the gate 102 within the first trench 103. The transistor structure 121 includes second trenches 105, 105' defining a mesa 108 in which the first trench 103 including the gate 102 is positioned. The source region 111 and the body region 112 are arranged on opposing sides of the first trench 103 as in the transistor structure 101 illustrated in FIG. 7.

The first trench 103 includes an insulating layer 110 which lines the base 117 and sidewalls 118 of the first trench 103 and forms a gap in the first trench 103 in which the conductive material forming the gate 102 is positioned. In the semiconductor device 120, the upper surface of the gate 102 is spaced at a distance from the first major surface 106 of the semiconductor body 107 and is positioned within the first trench 103. The gate 102 is covered by an insulating layer 110 which extends to the first major surface 106 and is coplanar with the first major surface 106. In this embodiment, the gate 102 has an upper surface which is positioned below the first major surface 106 of the semiconductor body and below the uppermost surface of the mesa 108 such that the uppermost portion of the gate 102 overlaps with the lower portion of the source region 111. In this embodiment, the conductive layer 114, which is electrically coupled to the field plates 104 in the second trenches 105, the body region 112 and the source region 111, also extends directly over the top of the first trenches 103 as it is electrically isolated from the gate 102 in the first trenches 103 by the insulating layer 110 arranged on the gate 102. An electrical connection to the gate 102 may be formed by a conductive via (not seen in the view of FIG. 8) which is positioned laterally outside and spaced apart from the conductive metal layer 114. The conductive via may be arranged in an edge region, for example, and be electrically coupled to a metal layer which may be referred to as a gate runner. The metal layer may extend substantially perpendicular to the plurality of first trenches 103 and electrical couple the gates 102 arranged in the plurality of first trenches 103 together.

FIG. 9 illustrates a semiconductor device 130 including a transistor structure 131 which is similar to that illustrated in FIG. 7, whereby like reference numerals indicate like parts. The transistor structure 131 differs from the transistor structure 101 illustrated in FIG. 7 in the arrangement of the source region 111.

In the embodiment illustrated in FIG. 9, the source region 111 extends from the sidewall 118 of the first trench 103 to the sidewall 119 of the second trench 105 and forms a portion of the sidewall 118 of the first trench 103 and sidewall 119 of the second trench 105. The transistor structure 131 may also include a body contact region 132 which extends from the source region 111 into the body region 112. The body contact region 132 may be positioned adjacent the sidewall 119 of the second trench 105 and may be positioned in the body region 112. The body contact region 132 has a lateral extent which is smaller than the distance between facing sidewalls 118, 119 of the first trench 103 and second trench 105, respectively, such that the source region 111 forms a pn junction with the body region 112 in the region immediately adjacent the sidewall 118 of the first trench 103 and a pn junction with the body contact region 132 adjacent the sidewall 119 of the second trench 105. In the embodiment illustrated in FIG. 9, the conductive metal layer 114 extends into the upper portion of the second trench 105 and is in direct contact with the field plate 104, the body contact region 132, the side face and top face of the source region 111.

The gate 102 may be substantially coplanar with the first major surface 106 and may be covered by an insulating layer 115 which protrudes above the first major surface 106 of the semiconductor body 107. The metal layer 114 may be arranged on this insulating layer 115.

In a further embodiment (not shown in FIG. 9), the gate 102 has an upper surface which is positioned below the first major surface 106 of the semiconductor body and below the uppermost surface of the mesa 108 such that the uppermost portion of the gate 102 overlaps with the lower portion of the source region 111. This embodiment combines the features for connecting the field plates 104, source regions 111 and body regions 112 as described with respect to FIG. 9 with the features for the gate electrode 102 with respect to the source region 111 as described in FIG. 8.

FIG. 10 illustrates a semiconductor device 140 including a transistor structure 141 which is similar to that illustrated in FIG. 9. The transistor structure 141 differs from the transistor structure 131 in the arrangement of the gate 102 with respect to the first major surface 106. In this embodiment, the uppermost surface of the gate 102 is positioned above the uppermost surface of the source region 111.

In the embodiments illustrated in FIGS. 1 to 10, the trenches have an elongate or strip-like structure such that they extend substantially parallel to one another into the plane of the drawing. The trenches may include a gate and a field plate, just a gate or just a field plate. However, the trenches may have forms other than elongate or strip-like forms in plan view and may be have the form of columnar trenches. A columnar trench may have various forms in plan view. For example, the columnar trench may be circular, square, or hexagonal in plan view. In embodiments in which the trenches have a columnar structure, the trenches may be arranged in a two-dimensional array in plan view, for example in rows and columns which may be aligned, for example to form a square grid array or a rectangular grid array, or adjacent rows may be offset, for example to produce a hexagonal close packed type array.

The columnar trenches may include only a field plate and separate elongate strip-like trenches may be provided for the gate. In some embodiments, rows of columnar trenches including a field plate may be arranged on either side of an elongate trench including a gate. The columnar trenches including the field plate may be spaced at intervals on either side of the strip-like elongate trench including the strip-like elongate gate. In some embodiments, a trench having the form of a grid may be provided for the gate and columnar trenches including a field plate may be arranged on either side of the trench including a gate such that a columnar trench is arranged in each cell defined by the grid of the gate trench.

FIGS. 11 to 13 illustrate examples of semiconductor devices including a transistor structure which has elongate trenches for the gate and columnar type trenches for the field plates. For better clarity, the source and gate metals providing electrical contact to the outside have been omitted. In the FIGS. 11 to 13, Source metal will be available on top of the first major surface 153 and providing low ohmic contact the doped semiconductor regions reaching an opened surface.

FIG. 11 illustrates a semiconductor device 150 comprising a transistor structure 151. The semiconductor 150 comprises a semiconductor body 152 including a first major surface 153 and a second major surface 154 opposing the first major surface 153. The transistor structure 151 includes a first trench 155 which extends from the first major surface 153 into the semiconductor body 152. The first trench 155 has an elongate form and in plan view the first trench 155 has the form of a grid. A gate electrode 156 is arranged in the first trench 155 and has the form of a grid. The gate 156 is electrically conductive and may comprise poly silicon or metal. An insulating layer 157 lines the sidewalls and base of the first trench 155 and electrically insulates the gate 156 from the semiconductor body 152. The upper surface of the gate 156 may be covered by an insulating layer which protrudes above the first surface first major surface 153 of the semiconductor body 152. Alternatively, if the upper surface of the gate 156 lies in a plane below the plane of the first major surface 153, the insulating layer covering the upper surface of the gate may be substantially coplanar with the first major surface 153.

The first trench 155 defines a plurality of mesas 159 protruding from the semiconductor body 152. In embodiments in which the first trench 155 forms a square grid, each of the mesas 159 may be substantially square in plan view. The transistor structure 151 further includes a plurality of second trenches 160 which have a columnar form and are arranged in each of the mesas 159 and extend from the first major surface 153 into the semiconductor body 152. The second trenches 160 include a field plate 161 which also has a columnar structure. The second trench 160 includes an insulating layer 162 which lines the sidewalls and base of the trench 160 and electrically insulates the field plate 161 from the semiconductor body 152. The field plate 161 may have lateral area which is substantially the same throughout its height. In some embodiments, the field plate 162 and/or the trench 160 may taper towards the base to provide a specular or needle-like form.

The mesa 159 includes a source region 163 arranged on a body region 164. The mesa 159 may also include a body contact region 165 which is in contact with both the body region 164 and the source region 163.

The semiconductor body 152 may include the first conductivity type. The source region 163 also includes the first conductivity type and is more highly doped than the body region 152. The body region 164 and the body contact region 165 include the second conductivity type. The body contact region 165 is more highly doped than the body region 164.

The transistor structure 151 further includes a drain region, which comprises the first conductivity type and which is more highly doped than the semiconductor body 152. The drain region is arranged underneath the trench 160 such that it is spaced apart from the base of the second trench 160 by a portion of the semiconductor body 152. The drain region may form the second major surface 154 or may be positioned between the semiconductor body 152 and a further substrate.

The source region 163 forms a pn junction with the body region 164 which is positioned at a depth $d_{pn}$ from the first major surface 153 of the semiconductor body 152. This pn junction is arranged as a depth $d_pn$ from the first major surface 153 which lies in the range of 50 nm to 300 nm. The source region 163 comprises first dopants to produce a n-type conductivity, in particular, phosphorus, and second dopants, having a different composition from the first dopant, which are selected to affect the diffusion of the first dopant when the semiconductor body is subjected to a thermal anneal to activate the first dopant and form the source region 163 of the first conductivity type. The second dopant may include carbon and/or fluorine. The source region 163 is free of arsenic dopants.

The arrangement of the source region 163, body region 164 and body contact region 165 may vary. FIGS. 11 to 13 illustrate three examples.

In the transistor structure 151 illustrated in FIG. 11, the source region 163 is arranged immediately adjacent the first trench 157 and the gate 156. The body contact region 165 is arranged adjacent the sidewall 167 of the second trench 160 and adjacent the source region 163 such that it forms a substantially vertical pn junction with the source region 163. Both the source region 163 and the body contact region 165 are arranged on the body region 164 which extends from the first trench 157 to the second trench 160. In this embodiment shown in FIG. 11, the body contact region 165 and the source region 163 have substantially equal depth into the semiconductor body 152. As described in combination with FIGS. 3 and 5, the body contact region 165 may also reach deeper into the semiconductor body 152.

In the embodiment illustrated in FIG. 12, the source region 163 extends from the sidewall 168 of the first trench 157 including the gate 156 to the sidewall 167 of the second trench 160 including the field plate 161. The body contact region 165 is arranged in the body region 164 adjacent the sidewall 167 of the second trench 160 and is in contact on its upper surface with the source region 163 and is surrounded on its lower side by the body region 164. The body contact region 165 can be considered to be arranged in the body region 164. In this embodiment, the field plate 161 overlaps with the body region 164 and body contact region 165 and the upper surface of the field plate 161 is arranged in the trench in a plane below the plane of the first major surface 153 and below the interface between the source region 163 and the body region 164.

The embodiment illustrated in FIG. 13, is similar to that described in FIG. 12. However, the field plate 161 is recessed deeper into the semiconductor body 152 than the upper end of the insulating layer 162. The field plate 161 in this embodiment is recessed less into the depth of the semiconductor body 152 than the depth of the body region. The embodiment according to FIG. 13 may provide more process flexibility concerning the recess of the field plate 161 and the ohmic contact of source region 163 and body contact region 165 to the source metal (not shown in FIGS. 11 to 13) as compared to FIG. 12.

Figure 14:
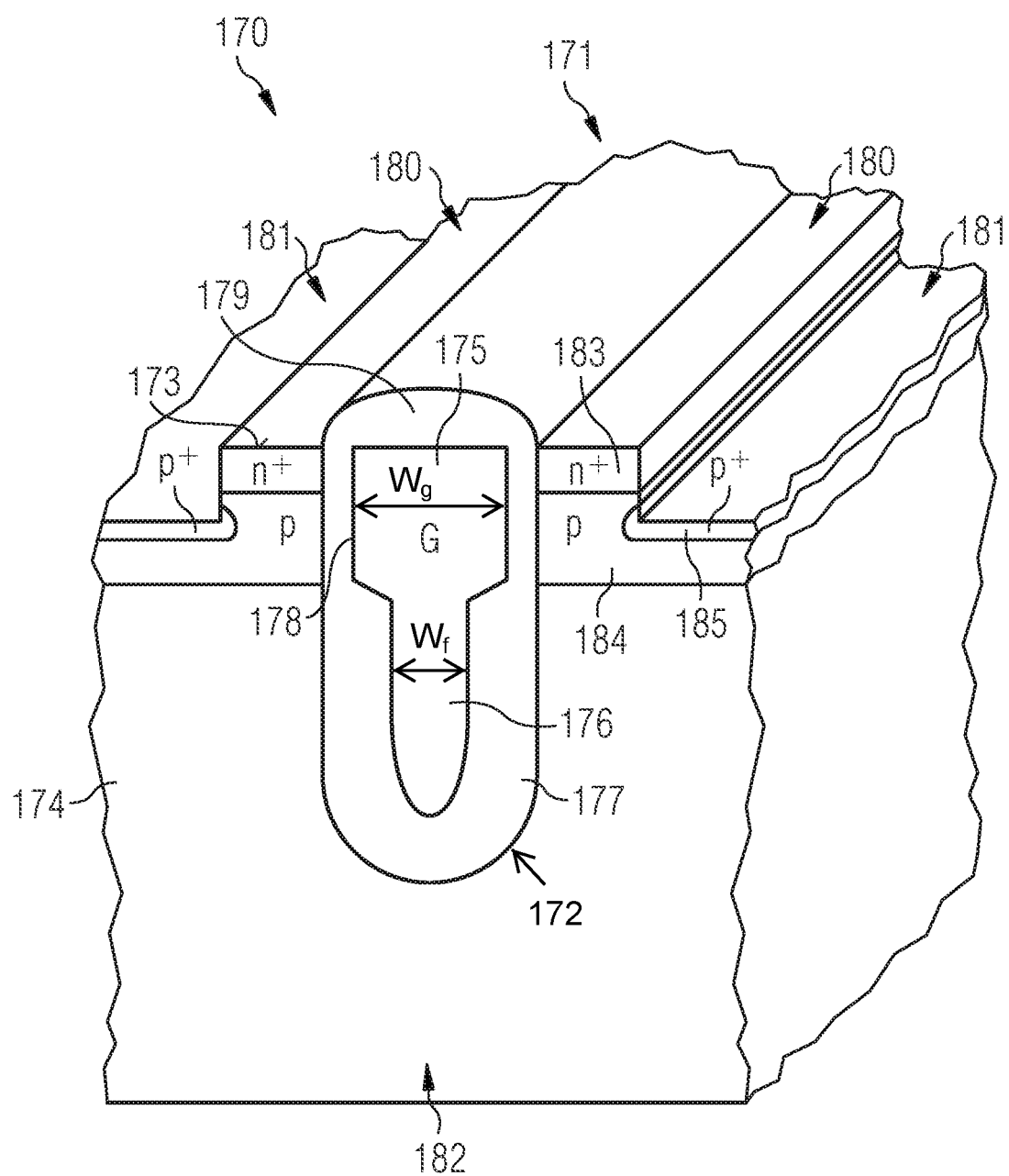
FIG. 14 illustrates a cross-sectional view of a portion of a semiconductor device according to an embodiment.

FIG. 14 illustrates a partial cross-sectional view of a portion of semiconductor device 170 including a transistor structure 171. The transistor structure 171 includes a trench 172 which extends from a first major surface 173 of a semiconductor body 174, which comprises the first conductivity type, into the semiconductor body 174. The trench 172 includes a gate 175 arranged in its upper portion which extends into a field plate 176 in the lower portion of the trench 172. The field plate 176 has a lateral width $w_f$ which a smaller than the lateral width $w_g$ of the gate 175. The trench 172 includes an insulating layer 177 which lines the base and sidewalls of the lower portion of the trench 172 and provides a field oxide (Fox). The trench 172 includes a further insulating layer 178 which lines the sidewalls of the upper portion of the trench 172 and has a thickness which is less than the thickness of the insulating layer 177 in the lower portion of the trench 172. The further insulating layer 178 may provide a gate oxide (Gox). The gate 175 with the integrated field plate 176 may be covered on its upper surface by further insulating layer 179 which may protrude above the first major surface 173 of the semiconductor body 174. The trench 172 may be elongate and have a strip-like form in plan view.

The semiconductor body 174 includes a mesa portion 180 extending on opposing sides of the trench 172. Shallow trenches 181 are arranged on opposing sides of the trench 172 forming a mesa 182 in which the trench 172 is arranged and bounded by the mesa portions 180. The mesa 182 includes a source region 183 comprising the first conductivity type, which is more highly doped than the semiconductor body 174 which is arranged in a strip-like well adjacent opposing sides of the trench 172. The source region 183 is arranged on a body region 184 which extends under the base of the shallow trench 181. The transistor structure 171 further includes a body contact region 185 which is arranged at and forms the base of the shallow trench 181 and which is surrounded by the body region 184.

In the embodiments described herein, the source region forms a pn junction with the underlying body region which is positioned at a distance or depth from the first major surface of the semiconductor body. At least a portion of the pn junction or interface is positioned at a distance of between 50 nm to 300 nm from the first major surface. The first major surface may be formed by upper portion of the source region such that this depth corresponds to the depth of the source region. The source region includes at least two types of dopant, whereby one or more of the dopants comprises a donor or acceptor to provide the desired conductivity type. In the illustrated embodiments, the source region includes phosphorus as a donor in order to provide n-type conductivity. The source regions also include a further dopant, which is different from the dopant providing the conductivity type, which is provided to provide a mechanism for controlling the diffusion of the first dopant or dopants during thermal annealing. Depending on the diffusion mechanism of the particular first dopant, the second dopant may be selected to prevent diffusion using a different mechanism. For example, diffusion of phosphorous ions may be controlled by carbon and/or fluorine dopants.

Discrete power switches with rather low blocking voltages (e. g. up to 300V, 100V, 60V, 30V) may have the requirement to provide ultra-low source path resistances since the total on-state resistance of these devices is already very low. Accordingly, any parasitic series resistances should be minimized. The resistance of the source is negative since it not only leads to a voltage drop in the load path but also to a reduced effective gate-channel-voltage drop reducing the channel conductivity and increasing turn-on-losses. On the other hand, the length of the source doping region to the channel region is large compared to state-of-the art CMOS devices and may reach values up to 200 nm or more due to constructive reasons of the transistor cell. Additionally, the source doping should not reach deeper into the semiconductor body than to the channel region to minimize the channel length/channel resistance and to avoid premature punch-through of the electric field in blocking operation.

Whilst high dose As implantation can be used to form shallow profiles, there is a risk of vacancy defect formation from As precipitation which potentially causes drain-source leakage currents, resulting in chip failure and low production yields.

According to embodiments described herein, the high dose As Implantation is replaced by a combination of Carbon Implantation and Phosphorous Implantation in order to achieve the same (or even better) electrical characteristics while reducing to even eliminating the risk of leakage current fails during blocking state at blocking voltages approaching the nominal blocking voltage of the device due to the creation of As defects. Some implanted dopants, such as carbon and fluorine reduce phosphorus diffusion. This can be used to produce to source-profiles with a very similar vertical extension to conventional As-profiles.

Phosphorus transient enhance diffusion is thought to occur via an interstitial diffusion mechanism. Techniques to block this mechanism and to control it include a carbon kick-out mechanism and fluorine-vacancy clusters, both of which can be used to consume the interstitials driving diffusion of the phosphorous. Additionally, P can be activated more efficiently in Si than As. Therefore, either better conductivity at the same implantation dose or a reduction of the implantation dose (and process cost) may be used to achieve the same electrical performance as that achieved by As.

The dimensions in power transistors differ from those of advanced logic since the source region has to penetrate deeper into the semiconductor to form an electric connection to the (mainly vertical) inversion channel at the gate dielectric. It is therefore not the target to establish ultra-shallow source regions but deeper source regions with a pn-junction at e.g. 50 nm to 200 nm from the Si surface whilst maintaining the same requirements for a steep gradient for low ohmic channel connection at a defined channel length.

In order to optimize a plateau-like P doping profile a sequence of C and/or F implantations with different implantation energies can be used. Channeling implantation conditions as well as the use of an energy diffusor in front of the wafer, transforming the mono-energetic ion beam into a multi-energy one—yielding an adjustable ion depth distribution in the semiconductor device—may be used. Thereby, diffusion can be regulated according to device needs, e.g. an optimum vertical distribution of P in the source zone. For the case of steepest gradients, a Co-Implantation of Si and C before applying the P doping implant may be beneficial.

Different sequences of C only, F only or a combined sequence of C and F implantation can be used, followed by a single or multiple P implantations. Ge could be used.

Besides optimized source regions, device regions deep in the semiconductor body can be tailored, e.g. ~10 µm plateau-like P doping profiles with a steep gradient at the end of the plateau. This can be realized either by the use of an energy diffusor for C/F/P implantations or by a sequence of implantation energies of these elements.

In the embodiments describe above, the semiconductor body may have a doping concentration which is usefully in the range of $1·10^{14}$ cm$^{-3}$ to $1·10^{18}$ cm$^{-3}$, conveniently in the range of $7·10^{14}$ cm$^{-3}$ to $3·10^{17}$ cm$^{-3}$, and more conveniently in the range of $1·10^{18}$ cm$^{-3}$ to $1·10^{16}$ cm$^{-3}$, but higher or lower doping concentrations may also be used. The drain region may have doping concentration usefully at least $5·10^{19}$ cm$^{-3}$, conveniently at least $1·10^{20}$ cm$^{-3}$ and more conveniently at least $3·10^{20}$ cm$^{-3}$, but higher or lower doping concentrations may also be used. The source region may have doping concentration usefully of at least $5·10^{19}$ cm$^{-3}$, conveniently of at least $1·10^{20}$ cm$^{-3}$, and more conveniently of at least $3·10^{20}$ cm$^{-3}$, but higher or lower doping concentrations may also be used. The body region may have doping concentration usefully in the range of $1·10^{17}$ cm$^{-3}$ to $1·10^{20}$ cm$^{-3}$, conveniently in the range of $2·10^{17}$ cm$^{-3}$ to $7·10^{18}$ cm$^{-3}$, and more conveniently in the range of $5·10^{17}$ cm$^{-3}$ to $5·10^{18}$ cm$^{-3}$, but higher or lower doping concentrations may also be used. The body contact region may have a doping concentration in the range of $1·10^{18}$ cm$^{-3}$ to $2·10^{20}$ cm$^{-3}$.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a silicon semiconductor body comprising a first major surface, a second major surface opposing the first major surface, and a first conductivity type;
    a gate arranged in a trench extending into the silicon semiconductor body from the first major surface;
    a body region formed in the silicon semiconductor body and comprising a second conductivity type, the second conductivity type opposing the first conductivity type;
    a source region formed in the silicon semiconductor body and comprising the first conductivity type, the source region being arranged on the body region and comprising at least one first dopant species providing the first conductivity type and at least one second dopant species that is different from the first dopant species, the second dopant species reducing the diffusion of the first dopant species in the silicon semiconductor body, wherein the source region forms a pn-junction with the body region, the pn-junction being arranged at a depth $d_{pn}$ from the first major surface, wherein 50 nm<$d_{pn}$<300 nm;
    a device region of the first conductivity type formed deeper in the silicon semiconductor body than the source region; and
    a drain region comprising the first conductivity type, the drain region being arranged in the silicon semiconductor body under the trench,
    wherein the at least one first dopant species comprises phosphorous ions,
    wherein the at least one second dopant species comprises carbon and/or fluorine,
    wherein the device region comprises the at least one first dopant species providing the first conductivity type and the at least one second dopant species reducing the diffusion of the first dopant species in the silicon semiconductor body.

2. The semiconductor device of claim 1, wherein the source region comprises a phosphorous concentration in a range of $5.10^{19}$ atoms/cm$^3$ to $7.10^{20}$ atoms/cm$^3$ and a carbon concentration in a range of $1.10^{19}$ up to $7.10^{20}$ atoms/cm$^3$.

3. The semiconductor device of claim 1, further comprising a body contact region comprising the second conductivity type, wherein the body contact region is more highly doped than the body region.

4. The semiconductor device of claim 3, wherein the trench is elongated and has a depth, a width and a length, the length being greater than the width, and wherein the body contact region is arranged adjacent the source region in a direction of the width of the trench or in a direction of the length of the trench.

5. The semiconductor device of claim 4, further comprising a shallow trench extending from the first major surface, wherein sidewalls of the shallow trench are formed by the source region and the body region, and wherein the body contact region forms a base of the shallow trench.

6. The semiconductor device of claim 1, further comprising a field plate arranged in the trench under the gate.

7. The semiconductor device of claim 1, wherein sidewalls of the trench are formed by the source region and the body region, and wherein the semiconductor device further comprises:
  a further trench comprising sidewalls formed by the body region and the silicon semiconductor body; and
  a field plate arranged in the further trench.

8. The semiconductor device of claim 1, wherein the at least one second dopant species comprises only carbon.

9. The semiconductor device of claim 1, wherein the at least one second dopant species comprises only fluorine.

10. The semiconductor device of claim 1, wherein the at least one second dopant species comprises both carbon and fluorine.

11. The semiconductor device of claim 1, wherein the at least one second dopant species further comprises germanium.

* * * * *

UNITED STATES PATENT AND TRADEMARK OFFICE
CERTIFICATE OF CORRECTION

PATENT NO. : 11,171,230 B2  Page 1 of 1
APPLICATION NO. : 16/165831
DATED : November 9, 2021
INVENTOR(S) : A. Mauder et al.

It is certified that error appears in the above-identified patent and that said Letters Patent is hereby corrected as shown below:

On the Title Page

Page 2/U.S. Pat. Docs. (Column 2, Line 10), please change "Koji Ma" to -- Kojima --.

Signed and Sealed this
First Day of March, 2022

Drew Hirshfeld
*Performing the Functions and Duties of the*
*Under Secretary of Commerce for Intellectual Property and*
*Director of the United States Patent and Trademark Office*